United States Patent [19]
Pyle et al.

[11] Patent Number: 5,831,428
[45] Date of Patent: Nov. 3, 1998

[54] METERING UNIT WITH INTEGRATED USER PROGRAMMABLE LOGIC

[75] Inventors: Michael W. Pyle, Hermitage; Lee D. Wallis; David C. Carlson, both of Mursfreesboro; Donald T. McComas, Nolensville, all of Tenn.

[73] Assignee: Square D Company, Palatine, Ill.

[21] Appl. No.: 561,095

[22] Filed: Nov. 21, 1995

Related U.S. Application Data

[63] Continuation of Ser. No. 159,886, Nov. 30, 1993, abandoned.

[51] Int. Cl.$^6$ .............................. G06F 15/46; G01R 7/00
[52] U.S. Cl. .......................................... 324/142; 324/483
[58] Field of Search ................................ 324/103 R, 142, 324/141, 117 R, 127; 364/481, 483, 49 D, 491, 551.01, 571.01, 550; 340/870.02, 870.11, 825.35, 74

[56] References Cited

U.S. PATENT DOCUMENTS

| | | | |
|---|---|---|---|
| 4,291,375 | 9/1981 | Wolf | 324/103 R |
| 4,298,839 | 11/1981 | Johnson | 324/96 |
| 4,709,339 | 11/1987 | Fernandes | 324/127 |
| 4,839,819 | 6/1989 | Begin et al. | 364/483 |
| 4,884,021 | 11/1989 | Hammond et al. | 324/142 |
| 4,989,155 | 1/1991 | Begin et al. | 324/142 |
| 5,122,735 | 6/1992 | Porter et al. | 324/142 |
| 5,153,837 | 10/1992 | Shaffer et al. | 324/103 R |
| 5,164,875 | 11/1992 | Haun et al. | 361/64 |
| 5,212,441 | 5/1993 | McEachern et al. | 324/142 |
| 5,224,054 | 6/1993 | Wallis | 364/483 |
| 5,233,538 | 8/1993 | Wallis | 364/483 |
| 5,247,454 | 9/1993 | Farrington et al. | 364/483 |
| 5,270,949 | 12/1993 | Atherton et al. | 324/142 |
| 5,315,235 | 5/1994 | Atherton et al. | 324/142 |
| 5,467,286 | 11/1995 | Pyle et al. | 364/483 |
| 5,537,029 | 7/1996 | Hemminger et al. | 324/142 |
| 5,537,333 | 7/1996 | Hemminger et al. | 364/492 |
| 5,544,089 | 8/1996 | Hemminger et al. | 364/492 |
| 5,548,527 | 8/1996 | Hemminger et al. | 364/492 |
| 5,555,508 | 9/1996 | Munday et al. | 364/492 |
| 5,621,629 | 4/1997 | Hemminger et al. | 363/56 |
| 5,631,843 | 5/1997 | Munday et al. | 364/492 |

*Primary Examiner*—Vinh P. Nguyen
*Attorney, Agent, or Firm*—Larry I. Golden; Kareem M. Irfan

[57] ABSTRACT

A metering unit, located in a distributed power network carrying a power-related waveform, comprises a sensor, a generator, and a memory. The sensor senses power-related parameters associated with the power-related waveform. In response to the sensor, the generator generates and transmits data representative of the power-related waveform. The memory is a sector-erasable flash EEPROM having stored therein programmable logic and main functionality firmware for execution by the generator. The logic is programmable by a user and executable by the generator to increase operations performed by the metering unit.

6 Claims, 8 Drawing Sheets

METERING UNIT WITH INTEGRATED USER PROGRAMMABLE LOGIC

This application is a continuation of application Ser. No. 08/159,886, filed Nov. 30, 1993, now abandoned.

FIELD OF THE INVENTION

The present invention relates generally to techniques and arrangements for measuring, communicating and analyzing parameters associated with electrical distributed power networks. More particularly, the present invention relates to a metering unit with integrated user programmable logic.

BACKGROUND OF THE INVENTION

Industrial power users are rapidly becoming aware of the importance of monitoring distributed power networks. Proper monitoring can provide tangible benefits with respect to equipment operation and maintenance; therefore, significant return on investment. More specifically, these benefits include savings in terms of equipment energy cost and maintenance costs, better equipment utilization, and increased system reliability.

Electric utility applications have ranged from supervisory control and data acquisition (SCADA) systems, primarily concerned with remote operations, to distribution automation, which focuses on operating efficiency. Certain utility applications have included devices mounted on power lines for sensing operating parameters of an associated power conductor. For example, U.S. Pat. Nos. 5,224,054 and 5,233,538 describe a circuit monitoring system for a distributed power network. The system includes a plurality of metering units and a control station, which is coupled to each of the metering units via a multi-drop communications link. Each of the metering units is disposed adjacent to an associated one of the branches in the network for sensing power parameters in the branches and for generating and transmitting data representing the power parameters to the control station. The control station is used for generating monitoring commands to each of the metering units to provide the system with fill system control and evaluation capability.

Programmable logic permits a user to customize metering unit operation for special metering, control, or data logging applications. For example, these applications can range from something as simple as creating a new quantity based on an arithmetic combination of previously metered values to performing complex logic evaluations based on the metered data in order to make control decisions. Heretofore, such customized metering unit operation is accomplished using programmable logic controllers (PLCs) or personal computers (PCs) connected to the metering units over a communications link.

A drawback of using these external devices to customize metering units is that it does not guarantee that coincident data from one metering cycle will be used to obtain solutions for custom applications. In making calculations for custom applications, it is often necessary for a PLC or PC to communicate several times over the communications link in order to obtain data. The speed at which data is obtained over the communications link, however, is limited by the data flow rate (i.e., baud rate) of the link. Since this data flow rate is relatively slow, data polled by the PLC or PC from a metering unit in one communication may not be from the same metering cycle as data polled by the PLC or PC in another communication.

A need therefore exists for a metering unit which overcomes the above-noted drawback associated with existing techniques for customizing metering units.

SUMMARY OF THE INVENTION

A general object of the present invention is to provide a metering unit which incorporates application-specific programmable logic into the metering unit itself to customize metering unit operation.

Another object of the present invention is to provide a metering unit which can guarantee that coincident data from one metering cycle will be used to obtain solutions for custom applications.

Other objects and advantages of the invention will be apparent from the following detailed description and accompanying drawings.

In accordance with the present invention, the foregoing objects are realized by providing a metering unit located in a distributed power network carrying a power-related waveform. The metering unit comprises a sensor, a generator, and a memory. The sensor senses power-related parameters associated with the power-related waveform. In response to the sensor, the generator generates and transmits data representative of the power-related waveform. The memory has stored therein programmable logic and main functionality firmware for execution by the generator. The logic is programmable by a user and executable by the generator to increase operations performed by the metering unit.

BRIEF DESCRIPTION OF THE DRAWINGS

Other objects and advantages of the invention will become apparent upon reading the following detailed description and upon reference to the drawings in which.

Figure 1:
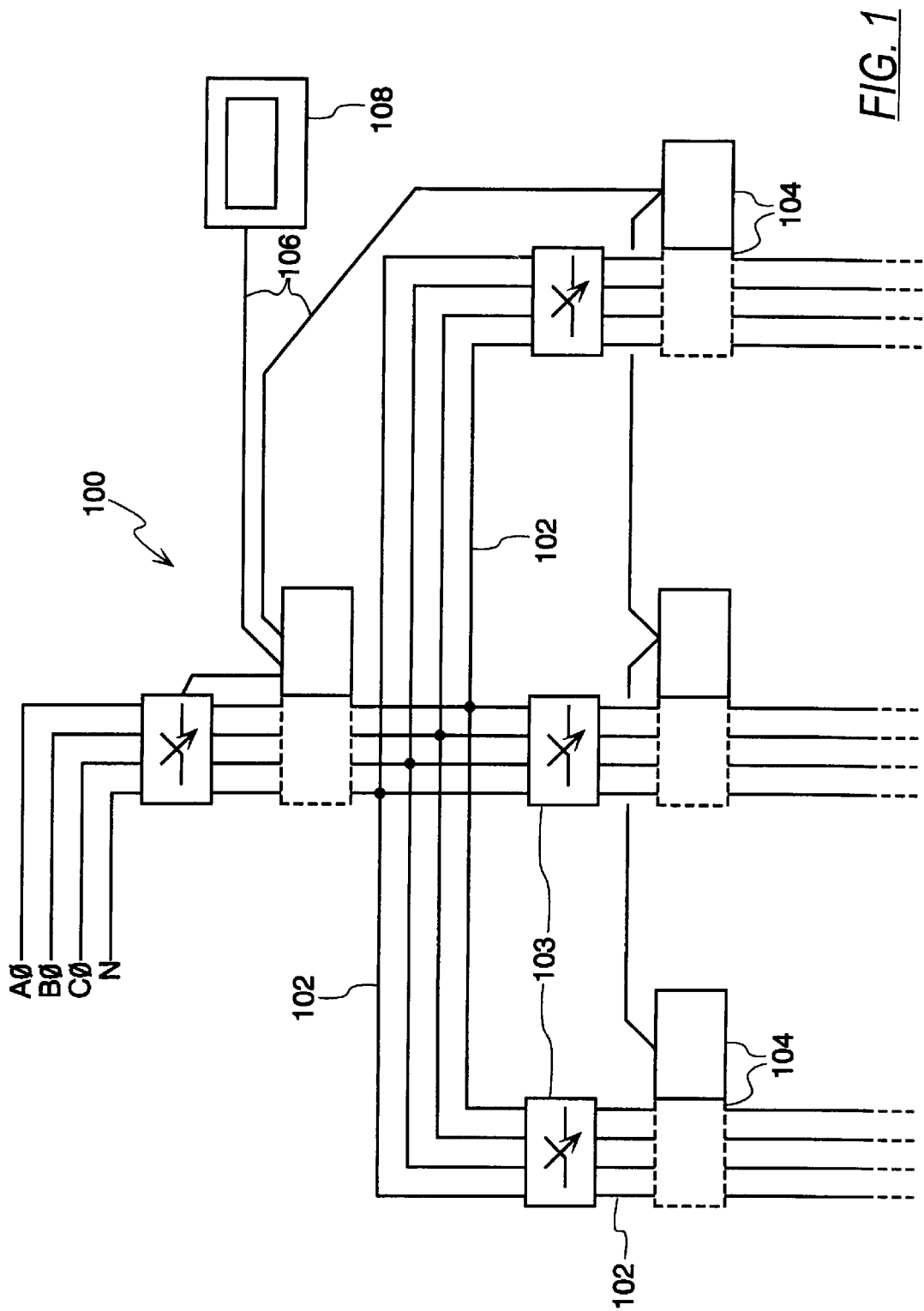
FIG. 1 is a block diagram of a three-phase distributed power network having a monitoring system coupled thereto for monitoring and evaluating power parameters in the network.

While the invention is susceptible to various modifications and alternative forms, a specific embodiment thereof has been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

The present invention is particularly advantageous in industrial applications wherein a distributed power network supplies power to a multitude of loads, e.g., various types of power equipment. FIG. 1 illustrates such an application in which a three-phase (A, B, C), four-wire (A–C, N) distribution system 100 feeds a number of network branches 102 and associated loads (not shown). While this system could be modified to accommodate a three-phase/three-wire, or other, implementation, the system shown in FIG. 1 is representative and the present invention is discussed within the context of this illustrated implementation.

In the system of FIG. 1, the network branches 102 include conventional interruption devices 103 for "breaking" the circuit path defined thereby. Adjacent the interruption devices 103, the system includes associated metering units 104, each of which is communicatively coupled via a communications link 106 to a control station 108. The communications link 106 may be implemented using the protocol set forth in SY/MAX® Instruction Bulletin, Dec. 8, 1988, available from Square D Company, Palatine, Ill. Together, the metering units 104, the communications link 106 and the control station 108 are used to implement a retro-fittable monitoring system for the distribution system 100. The control station 108 is preferably implemented using a desk-top controller, e.g., an IBM PC/AT® and compatibles, having a keyboard, a display and a processor for sending commands and for analyzing information sent from the metering units 104.

The monitoring system of FIG. 1 provides a user, located at the control station 108, with the ability to monitor the electrical activity in each branch, or at each load, remotely. Equally important, the communications link 106 and the control station 108 provide a conveniently located control point at which electrical activity at various points in the system can be monitored at certain predetermined times, under preselected conditions, and analyzed and evaluated for ongoing system and equipment maintenance and control. Using the control station 108, for example, all the metering units 104 may be instructed to sample the power in the associated network branches 102 at any given time. This sampling time can be preprogrammed by the control station 108, thereby collecting power-related information from all the network branches simultaneously. This is an important advantage, because it can be used to provide an overall evaluation of the system without having to compensate for errors that result from time-dependent system variations.

Figure 2:
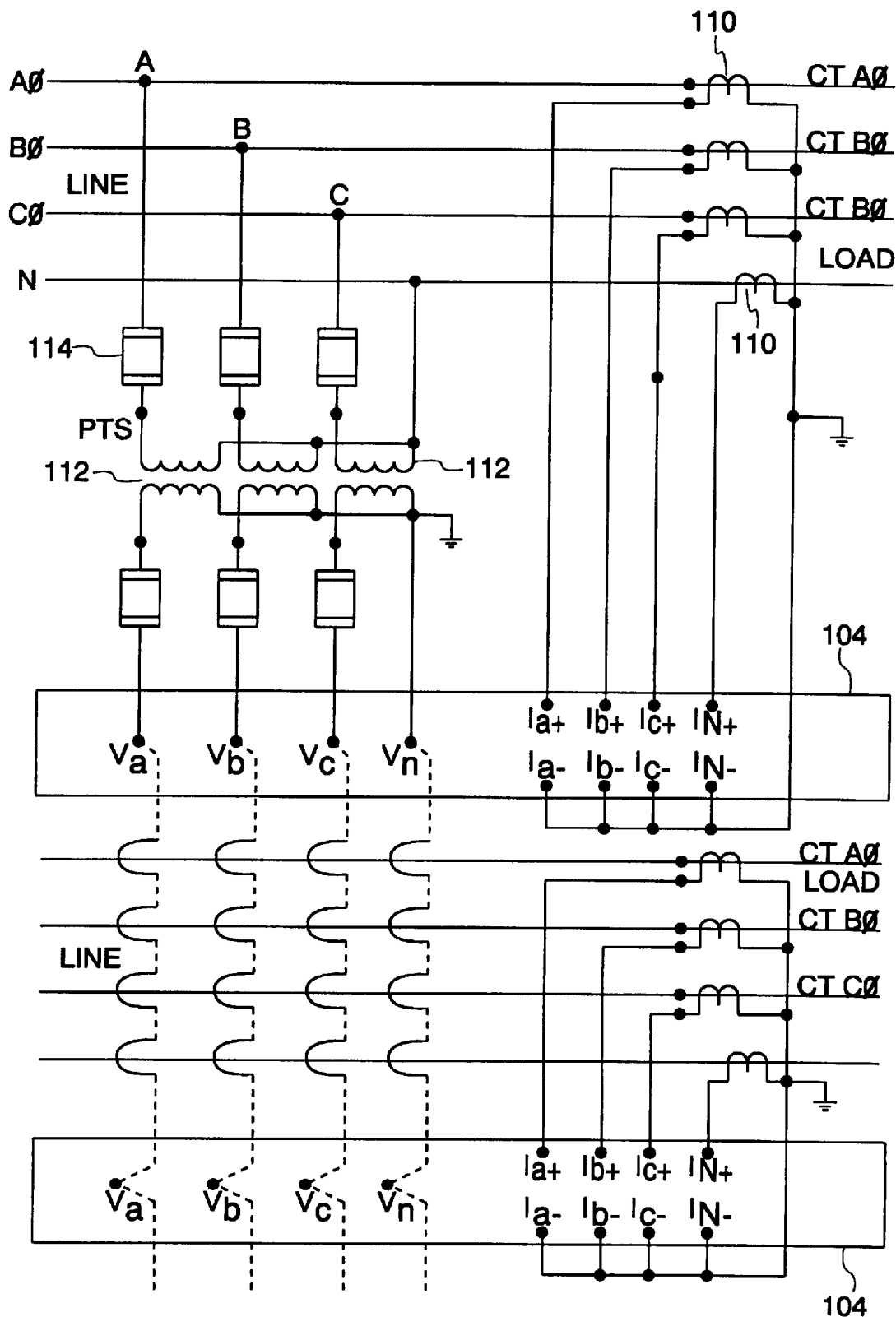
FIG. 2 is a diagram illustrating, in more detail, the manner in which the system of FIG. 1 is coupled to the three-phase distributed power network.

FIG. 2 illustrates a manner in which the metering units 104 of FIG. 1 may be coupled to the lines in each of the network branches 102. As shown in FIG. 2, one current transformer (CT) 110 is used for each phase and neutral line in each metering unit 104 with one side of each CT 110 electrically connected to ground for the associated metering unit 104. However, three potential transformers (PT) 112 may be shared by more than one metering unit 104 by arranging the PTs 112 to sense the voltages in parallel, unlike the arrangements of the CTs 110. Fuses 114 may be used to protect all the metering units 104 at their PT input terminals. Thus, a total of nine lines (twelve terminals) are used at each metering unit 104 for coupling the power-related information from the CTs 110 and PTs 112 to the metering units 104.

Figure 3:
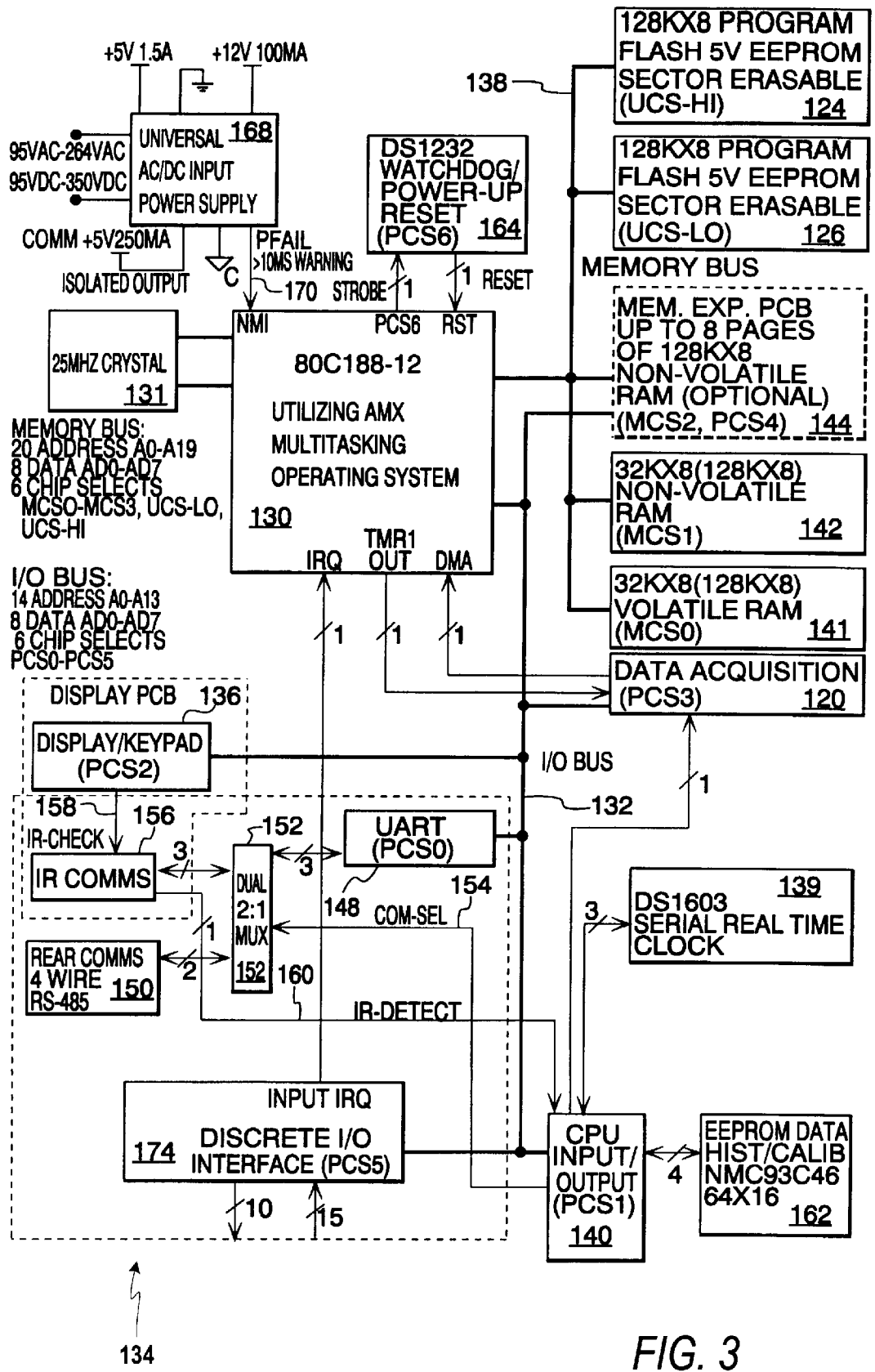
FIG. 3 is a block diagram of a metering unit or circuit monitor, embodying the present invention, which may be used for monitoring power parameters in the network of FIG. 1 and for transmitting that information to a central point for evaluation.

A preferred manner of processing the power-related information within each metering unit 104 is illustrated in FIG. 3. Generally, the power-related information is introduced to the metering unit 104 via a data acquisition unit 120. In the preferred embodiment described here, the metering unit 104 utilizes EEPROMs 124 and 126, preferably 128×8 Program Flash 5V, sector-erasable EEPROMs, to store boot code (e.g., unit reset firmware), main functionality firmware, and user programmable logic. A processor 130 executes the firmware to control the operation of the metering unit 104. The processor 130, preferably operating in an AMX Muititasking Operating System, is desirably coupled to a 25 MHz crystal 131 to provide a clock for the processor 130 and synchronization to the metering unit 104. An I/O bus 132 couples the processor 130 to various I/O components of the metering unit 104, such as communications circuitry 134, display/keypad circuitry 136 and the data acquisition unit 120. The I/O bus 132 can include a 14-bit wide address bus, an 8-bit wide data bus and 6 chip select lines (PCS0–PCS5). A memory bus 138 couples the processor 130 to the various memory units utilized by the preferred embodiment of the metering unit 104. The memory bus can include a 20-bit wide address bus, 8-bit wide data bus and six memory chip select lines (MCS0–MCS3, UCS-LO and UCS-HI). The processor 130 can be an 80C188-12 manufactured by Intel Corporation of Santa Clara, Calif.

The processor 130 of the preferred embodiment utilizes CPU I/O chips 140 coupled to the I/O bus 132 to provide latches and an input/output port for the address-based processor 130. The processor 130 controls the various components designated in FIG. 1 with a PCS# in parenthesis by selectively enabling the various components through the chip select lines (PCS0–PCS5) of the I/O bus 132. The processor 130 transfers data between the various components of the metering unit 104 utilizing the I/O bus 132 and the CPU I/O chips 140. Similarly, the processor 130 controls and enables the various memory components by selectively enabling the memory components' through the memory select lines of the memory bus 138. Moreover, the processor 130 accesses and stores data within the various memory components using the memory bus 138. The processor 130, by enabling and controlling the digital acquisition circuitry 120 through the I/O bus 132, collects simultaneous samples of the power-related information from the CTs 110 and the PTs 112 (FIG. 2) to acquire an extremely accurate and clear representation of the current and voltage waveforms carried in the associated network branch 102. It can be desirable for all the metering units 104 to time stamp data from the respective branches 102. Accordingly, the metering unit 104 is equipped with a serial real-time clock 139, such as a DS1603 made by Dallas Semiconductor of Dallas, Tex.

The data acquisition circuitry 120, under the control of the processor 130, digitizes these analog samples, and the processor 130 desirably stores those digital sample values using conventional, non-volatile RAM 142.

The processor 130 collects this digital sample data and performs power-related calculations on the digital sample data as directed by the firmware. Preferably, the processor 130 utilizes a conventional RAM 141 to assist in power-related calculations involving the sample digital data. These power-related calculations preferably include: the average demands of current in each of the three phases and of real power, the predicted demand of real power, the peak demand of current in each of the three phases and of real power, the accumulated real and reactive energy, rms calculations of voltage and current, and power quality calculations such as total harmonic distortion.

The processor 130 can transmit the processed or stored digital data to the control station 108 through the communications circuitry 134 that is coupled to the I/O bus 132. The communications circuitry 134 includes a communications interface 148. In the preferred embodiment, the communications interface 148 is a UART (universal asynchronous receiver/transmitter) that receives and transmits digital signals. The communications interface 148 is coupled to the I/O bus 132 and provides two-way communications between the metering unit 104 and the control station 108 through a communications port 150.

The communications port 150 is preferably a 4-wire, RS-485 communications port and is coupled to the communications interface 148 through a multiplexor (MUX) 152. The MUX 152 is controlled by a COM-SEL bit, and, in the absence of a Optical Communications Interface (OCI), the processor 130 controls the signal on a COM-SEL line 154 from the CPU I/O chips 140 to the COM-SEL bit of the MUX 152 and creates a data path between the communications interface 148 and the communications port 150. In the presence of the OCI (not shown), the processor 130 utilizes the CPU I/O chips 140 to toggle the signal on the COM-SEL line 154, and the MUX 152 alters the data path to route digital signals between the communications interface 148 and an infrared communications port 156. The infrared communications port 156 interacts with the OCI and provides an infrared communications link between the metering unit 104 and a personal computer (not shown) connected to the OCI. The OCI is preferably an infrared to RS-232 interface, and the personal computer links to the RS-232 port of the OCI interface.

The metering unit 104 includes display/keypad circuitry 136 to provide a user with a local interface with the metering unit 104. As previously stated, the display/keypad circuitry 136 is coupled to the I/O bus 132 to enable the user to interrupt the firmware operation of the processor 130 and perform any desired operations upon the metering unit 104. Additionally, in the illustrated embodiment, the display/keypad circuitry 136 transmits a digital signal to the infrared communications port 156 with an IR-CHECK line 158 for determining the presence of the OCI, and, if present, the OCI responds by sending the digital signal back to the infrared communications port 156 and through an IR-DETECT line 160 to the CPU I/O chips 140. The processor examines the signal on the IR-DETECT line 160 to determine if an OCI is present adjacent to the infrared communications port 156. As previously discussed, if an OCI is present, the preferred embodiment of the metering unit 104 utilizes the CPU I/O chips 140 to switch the MUX 152 into routing digital signals from the infrared communications port 156 to the communications interface 148.

Communications between the metering unit 104 and the control station 108 can be facilitated by entering the device address and the communication baud rate via the display/keypad circuitry 136. This allows the control station 108 to differentiate between the multitude of metering units 104 communicating over the communications link 106 (FIG. 1). Preferably, the designated address for the metering unit 104 can be programmed and stored in the non-volatile RAM 142 of the metering unit 104. In a preferred embodiment, for the metering unit 104, historical, calibration and identification information is preferably stored in a serial EEPROM 162 coupled to the CPU I/O chips 140. The EEPROM 162 is preferably a NMC93C46 EEPROM made by National Semiconductor of Santa Clara, Calif.

The metering unit 104 also includes a watchdog timer circuit 164 and a power supply 168. The watchdog timer circuit 164 is used by the processor 130 in a conventional manner to monitor its integrity, and may be implemented using a DS1232-type IC, available from Dallas Semiconductor, Inc. of Dallas, Tex. In the illustrated preferred embodiment, the processor 130 must continuously strobe the watchdog timer circuit 164, and if the processor 130 halts the expected strobing, the watchdog timer circuit 164 resets the processor 130. Additionally, the watchdog timer circuitry 164 resets the processor 130 if the Vcc voltage from the power supply 168 drops below a threshold voltage value.

The power supply 168 is conventional. The power supply 168 can be fed from an AC line to provide ±12v (Volts) and ±5v ("Vcc") for the entire metering unit 104 and a communications supply ("COM ±5v") for the communications circuitry 134. The power supply 152 is monitored by the processor 130, using a power fail line 170 coupled to the NMI (non-maskable interrupt) of the processor 130 to interrupt its operation and allow the processor 130 to store any necessary data in non-volatile memory, such as the non-volatile RAM 142, before operating power is lost. Preferably, the power supply 152 generates the power fail signal on a power loss or power sag at least 10 ms prior to dropping the Vcc output out of regulation.

The metering unit 104 is also equipped with an I/O interface 174 coupled to the I/O bus 132 and having latches and buffers for providing optional I/O operations. For example, the I/O interface 174 can be used to trigger the interruption devices 103 (FIG. 1) when one or more predetermined conditions have been detected within the metering unit 104 or at the control station 108. Moreover, the I/O interface 174 can be coupled to an external module or monitor if desired.

An important application of the present invention concerns retrofitting the metering unit 104, or the entire monitoring system of FIG. 1, with a previously installed interruption device 103 having a peak sensing tripping mechanism. Interruption devices of this type trip upon the detection of the peak of the waveform exceeding a predetermined threshold. Presuming the presence of a non-sinusoidal waveform, the metering units 104 of the present invention detect the peak value, calculate the RMS (root mean squared) value for a sinusoidal waveform having the same peak value and report that calculated value to the control station 108. This allows a user at the control station 108 to evaluate the suitability of the interruption device for the load connected thereto.

An important feature of the metering unit 104 is the incorporation of user programmable logic in the sector-erasable flash EEPROM 124, 126. This programmable logic is preferably located in the lowermost 16 kilobytes of the lower EEPROM 126 in FIG. 3, and is divided into three sections: initialization logic, metering logic, and off-line logic. A user programs this programmable logic by downloading programming instructions into the metering unit 104 via either the optical communications port 156 or the RS-485 serial communications port 150.

The initialization logic is performed only after the metering device comes out of reset and has completed its own metering initialization. The purpose of the initialization logic is to allow a one time setup of parameters which are used by the other two programmable logic sections.

The metering logic is executed by the processor 130 in each metering cycle of the metering unit 104. Without the metering logic, each metering cycle generally includes the step sequence of obtaining data, performing metering calculations, and performing secondary functions. These three steps are repeated for each metering cycle. In the preferred embodiment, application-specific metering logic is programmed in the metering unit 104 to be performed as part of the metering cycle. Thus, the metering cycle includes the step sequence of obtaining data, performing metering calculations, performing metering logic, and performing secondary functions. Since the metering logic is incorporated within the metering unit 104 itself and is performed in each metering cycle, the processor 130 is able to access the metering logic and perform calculations with the metering logic on coincident data. In addition, data from every metering update cycle is used.

The metering logic may be something as simple as generating a new quantity based on an arithmetic combination of already metered values. For example, the metering logic may be programmed by a user to calculate the average current of the three rms phase currents $I_A$, $I_B$, and $I_C$ obtained during each metering cycle.

Alternatively, the metering logic may perform complex logic evaluations based on the metered data in order to make control decisions to manage operations and maximize power system reliability. For instance, the logic may be programmed to determine how many of the three phase voltages are below a preselected threshold. If one or two, but not all three, of the phase voltages are below the threshold, the metering logic may be programmed to make a control decision such as operating a relay or setting a bit in a polled register for the purpose of initiating an alarm. Another example is to program the metering logic to determine whether any of the three rms phase currents exceeds a preselected threshold. If any of the phase currents exceeds the threshold, the metering logic may be programmed to reconfigure the metering unit 104 to generate more frequent data log entries (e.g., record metered data at intervals of 1 minute instead of 15 minutes).

The off-line logic is executed independently from the metering cycle. This logic is used for custom applications which do not need synchronization with the metering cycle or for applications which require an excessive amount of processing time to be completed. The off-line logic executes until it is complete and then restarts if the logic is still enabled.

Each of the foregoing sections of logic may be individually disabled, and the programmable logic preferably includes at least the following capabilities: if-then-else logic, multiply, divide, add, subtract, modulo operations, minimum/maximum evaluations, Boolean arithmetic, time of day evaluations, and device command control including discrete and analog output control.

Figure 4:
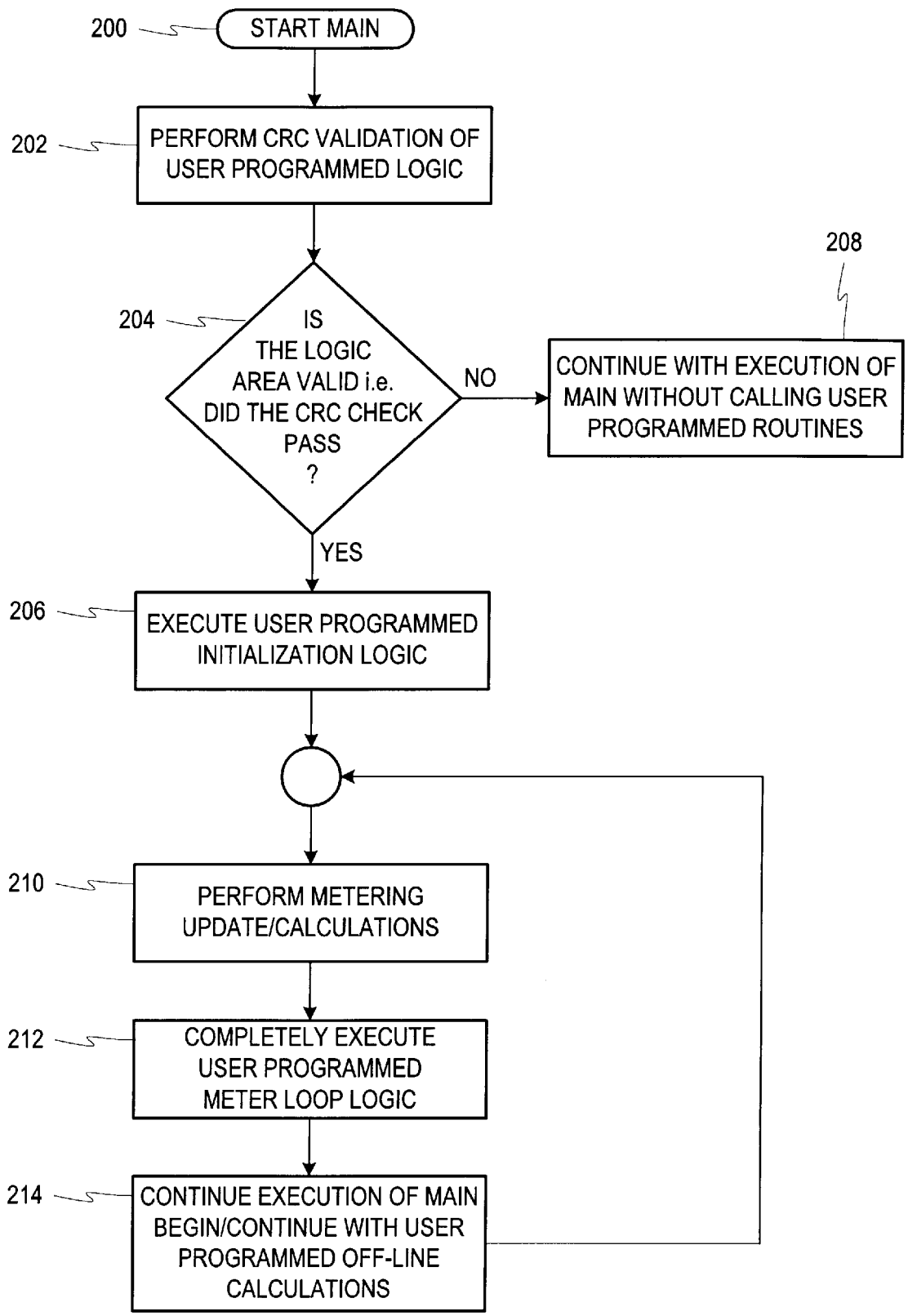
FIG. 4 is a flow chart showing the metering unit operation of performing user programmable logic, in accordance with the present invention.

FIG. 4 is a flow chart showing the execution of user programmed logic by the metering unit 104. After the processor 130 starts executing the main functionality firmware located in the sector-erasable flash EEPROMs 124, 126 (step 200), the processor 130 performs a CRC validation, i.e., cyclic redundancy check, of the user programmed logic (step 202). If the programmed logic is verified (step 204), the processor 130 executes the user programmed initialization logic (step 206). Otherwise, the processor 130 continues with the execution of the main functionality firmware without calling the user programmed logic routines (step 208). If the programmed logic is verified and the processor 130 executes the user programmed initialization logic, metering is performed in a cyclic loop in which the processor 130 obtains data and performs metering updates/calculations (step 210), completely executes the user programmed metering loop logic (step 212), and then continues execution of the main functionality firmware to perform secondary functions (step 214). The processor 130 repeats these steps 210, 212, and 214 in each metering cycle. At any time, the processor 130 may be instructed to execute user programmed off-line calculations which are performed independently from the metering cycle (step 214).

The power quality in the power distribution system 100 of FIG. 1 is represented by the amount of harmonic distortion in the voltage and current waveforms passing through the system 100. The greater the harmonic distortion, the worse the power quality. One consequence of harmonic distortion is that it places stress on the transformers 110 or 112, thereby causing transformer heating. A parameter used to measure the degree of transformer stress caused by harmonic distortion is known as the K-factor. Many transformers have an associated K-factor rating. For a particular metering cycle, the current K-factors for the phase currents $I_A$, $I_B$, and $I_C$ are given respectively by:

$$K\text{-}Factor_{IA} = \left[\sum_{k=1}^{k=31} k^2(I_{Ak})^2\right] / \left[\sum_{k=1}^{k=31} (I_{Ak})^2\right]$$

$$K\text{-}Factor_{IB} = \left[\sum_{k=1}^{k=31} k^2(I_{Bk})^2\right] / \left[\sum_{k=1}^{k=31} (I_{Bk})^2\right]$$

$$K\text{-}Factor_{IC} = \left[\sum_{k=1}^{k=31} k^2(I_{Ck})^2\right] / \left[\sum_{k=1}^{k=31} (I_{Ck})^2\right]$$

where $I_{Ak}$, $I_{Bk}$, and $I_{Ck}$ are the rms values of the kth harmonic of the phase currents $I_A$, $I_B$, and $I_C$.

The K-factors, as calculated above, provide only a limited measure of the stress placed on the associated transformers over time because it is possible to place less stress on the transformers when relatively low rms current levels are coupled with high K-factor values than when higher current levels are coupled with the same K-factor values. Thus, the transformer stress is dependent upon the rms current levels, as well as the K-factors. To provide a more instructive picture of the transformer stress, the main functionality firmware in the flash EEPROM 124, 126 preferably includes programming logic for calculating a parameter which will be referred to as K-factor demand.

The K-factor demand is determined by applying a thermal model over time to the real-time K-factor values calculated in the metering unit 104 over a preselected current demand interval. In particular, the K-factor demands for the phase currents $I_A$, $I_B$, and $I_C$ are given respectively by:

K-FactorDemand$_{IA}$=K-FactorDemand$_{IA}$+*Kdt* * (K-FactorAve−K-FactorDemand$_{IA}$)

K-FactorDemand$_{IB}$=K-FactorDemand$_{IB}$+*Kdt* * (K-FactorAve−K-FactorDemand$_{IB}$)

K-FactorDemand$_{IC}$=K-FactorDemand$_{IC}$+*Kdt* * (K-FactorAve−K-FactorDemand$_{IC}$)

where "K-FactorDemand" is initially equal to one, "Kdt" is a thermal constant based on the current demand interval, and "K-FactorAve" is the average of the K-factors calculated during a preselected interval of time (e.g., 15 seconds).

Two other parameters which are used to measure the transformer stress in the power distribution system 100 are the "K-FactorDemand at time of Peak Product" and the "CurrentDemand at time of Peak Product". Each of these parameters is partially derived from another parameter which will be referred to as current demand. Current demand is determined by applying a thermal model over time to the real-time rms current values calculated in the metering unit 104 over the preselected current demand interval. More specifically, the current demands for the phase currents $I_A$, $I_B$, and $I_C$ are given respectively by:

CurrentDemand$_{IA}$=CurrentDemand$_{IA}$+*Kdt* * (CurrentAve−CurrentDemand$_{IA}$)

CurrentDemand$_{IB}$=CurrentDemand$_{IB}$+*Kdt* * (CurrentAve−CurrentDemand$_{IB}$)

CurrentDemand$_{IC}$=CurrentDemand$_{IC}$+$Kdt$ * (CurrentAve−CurrentDemand$_{IC}$)

where "CurrentDemand" is initially equal to zero, and "CurrentAve" is the average of the rms phase current calculated during the preselected interval of time (e.g., 15 seconds).

For each phase, the "K-FactorDemand at time of Peak Product" is defined to be the value of the K-factor demand when the product of the K-factor demand and the current demand is greater than the previous peak product of the K-factor demand and the current demand. Similarly, the "CurrentDemand at time of Peak Product" is defined to be the value of the current demand when the product of the K-factor demand and the current demand is greater than the previous peak product of the K-factor demand and the current demand. The K-factor demand, as well as the above two parameters, provide an effective measure of the stress placed on the transformers in the power distribution system 100.

Figure 5:
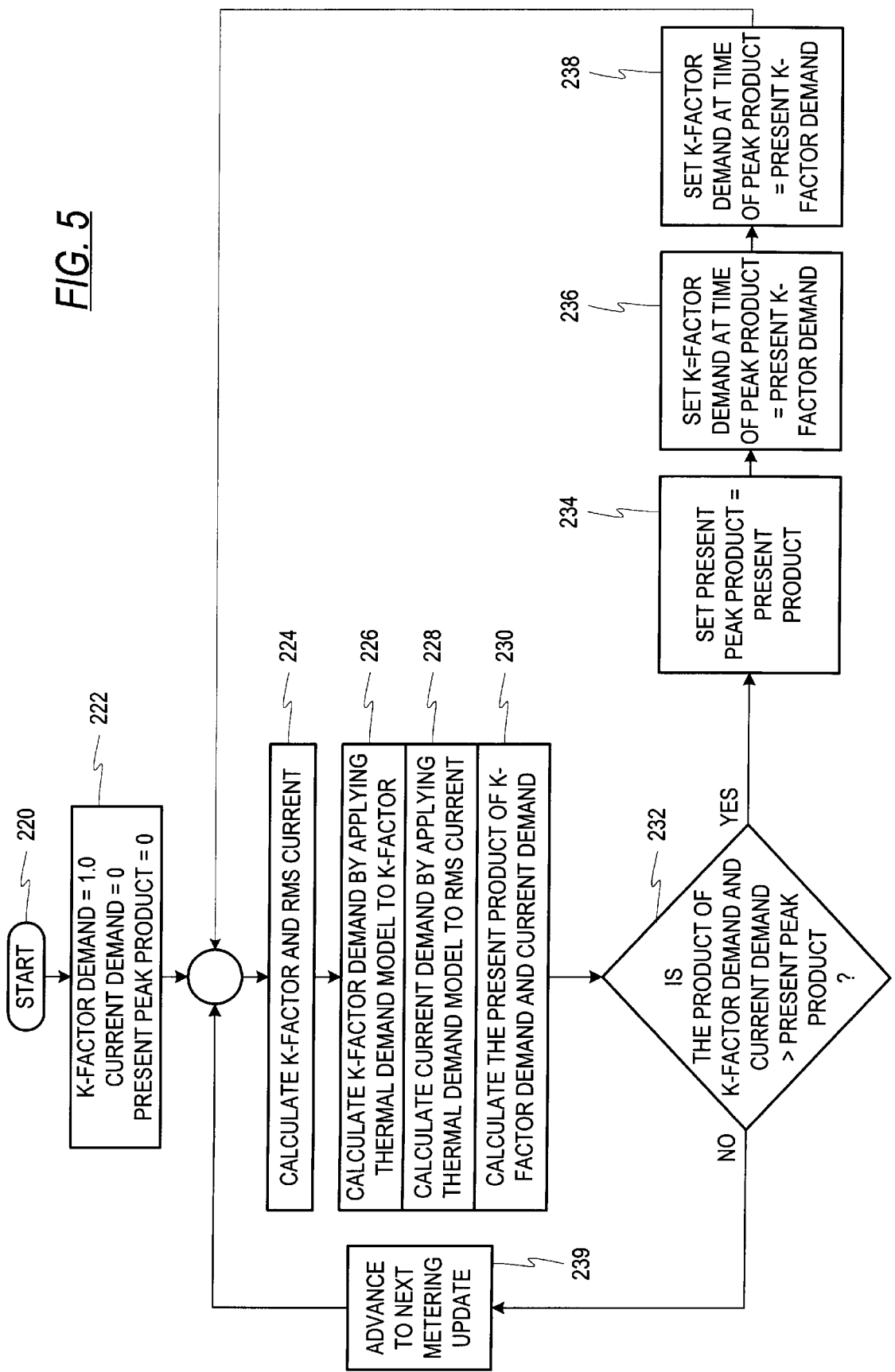
FIG. 5 is a flowchart showing the metering unit process for generating K-factor demand, "K-FactorDemand at time of Peak Product", and "Current-Demand at time of Peak Product"

FIG. 5 is a flowchart showing the process for generating the K-factor demand, the "K-FactorDemand at time of Peak Product", and the "CurrentDemand at time of Peak Product" for a particular current phase. At the start (step 220), the K-factor demand is set equal to one and the current demand is set equal to zero (step 222). Therefore, the present peak product of the K-factor demand and the current demand is equal to zero. Next, the K-factor and rms phase current are calculated, and the average of these two parameters is calculated for a preselected time interval (step 224). Based on the values found in steps 222 and 224, the K-factor demand and current demand are calculated by applying the thermal demand model to the K-factor and the current demand, respectively (steps 226 and 228).

Also, the present product of the calculated K-factor demand and current demand is determined (step 230). If the product of the K-factor demand and current demand is greater than the stored peak product (step 232), which was initially set to zero, then the stored value for peak product is overwritten with the present product (step 234). Moreover, both the "K-FactorDemand at time of Peak Product" and the "CurrentDemand at time of Peak Product" take on the respective values of the K-factor demand and the current demand at the time of this new peak product (steps 236 and 238). Following the memory updates in steps 234, 236, and 238, the processor 130 may advance to the next metering cycle. If, at step 232, the product of the K-factor demand and current demand is not greater than the stored peak product, then no memory updates occur during the present metering cycle and the processor 130 may proceed to the next metering cycle (step 239). For each metering cycle, the latest K-factor demand and current demand values are calculated, and the stored values for the "K-FactorDemand at time of Peak Product" and the "CurrentDemand at time of Peak Product" are updated if the product of the latest K-factor demand and current demand values exceeds the stored peak product value.

The foregoing process in FIG. 5 is programmed into the main functionality firmware located in the flash EEPROM 124, 126 of the metering unit 104, and is executed by the processor 130 during each metering cycle. The values of the parameters employed in the process are stored in either the nonvolatile RAM 142 or the volatile RAM 141.

Another feature of the metering unit 104 is that any metered value can be assigned under and over alarm threshold levels (e.g., under or over voltage alarm). Furthermore, the metering unit 104 can calculate the respective minimum or maximum value a parameter has reached after it has already passed the threshold level. In prior metering devices, one method for obtaining the minimum or maximum value of a parameter was to poll the metering device with a polling device over a communications link and periodically log the parameter at the polling device while the alarm is active. One drawback of this method is that in order for the polling device to log most data samples, the polling device must tie up the communications link, thereby preventing other networked devices from using the link. In logging most data samples, the polling device uses up large amounts of its memory. If the polling device does not log most data samples, the potential exists to miss the minimum or maximum value of the parameter after it has passed the alarm threshold level. Another drawback of this method is that it is difficult to correlate the logged data to the occurrence of the alarm threshold level.

Another prior method for obtaining the minimum or maximum value of a parameter was to periodically log the parameter at the metering device itself while the alarm is active. While this method does not tie up a communications link, this method still uses up large amounts of memory in the metering device because the metering device must log the parameter at short intervals to avoid missing the minimum or maximum value of the parameter. In addition, using this method still makes it difficult to correlate the logged data to the occurrence of the alarm threshold level.

The metering unit 104 avoids the drawbacks of the foregoing methods by providing the parameter extremes which occur while an alarm is in "pickup" (i.e., the value of the parameter has surpassed the alarm threshold level but has not surpassed it for the preselected amount of time to activate an alarm) and while the alarm is active.

In particular, while an under or over alarm is in pickup, a respective minimum or maximum is maintained on the parameter on which the alarm is based. After the alarm has been in pickup for a time period greater than or equal to the pickup time delay (i.e., time between surpassing alarm threshold and activation of alarm), this respective minimum or maximum is stored in the nonvolatile RAM 142. This respective minimum or maximum is referred to as the "Data Extreme During Alarm Pickup". The "Data Extreme During Alarm Pickup" is logged in the nonvolatile RAM 142, along with the date and time of alarm occurrence and an alarm identification indicating the parameter which caused the alarm.

While the under or over type alarm is active following pickup, a new respective minimum or maximum is maintained on the parameter on which the alarm is based. This respective minimum or maximum is maintained as long as the alarm is active, and is referred to as the "Data Extreme During Active Alarm". The "Data Extreme During Active Alarm" is also logged in the nonvolatile RAM 142, along with the date and time of alarm exit and the alarm identification.

Figure 6A:
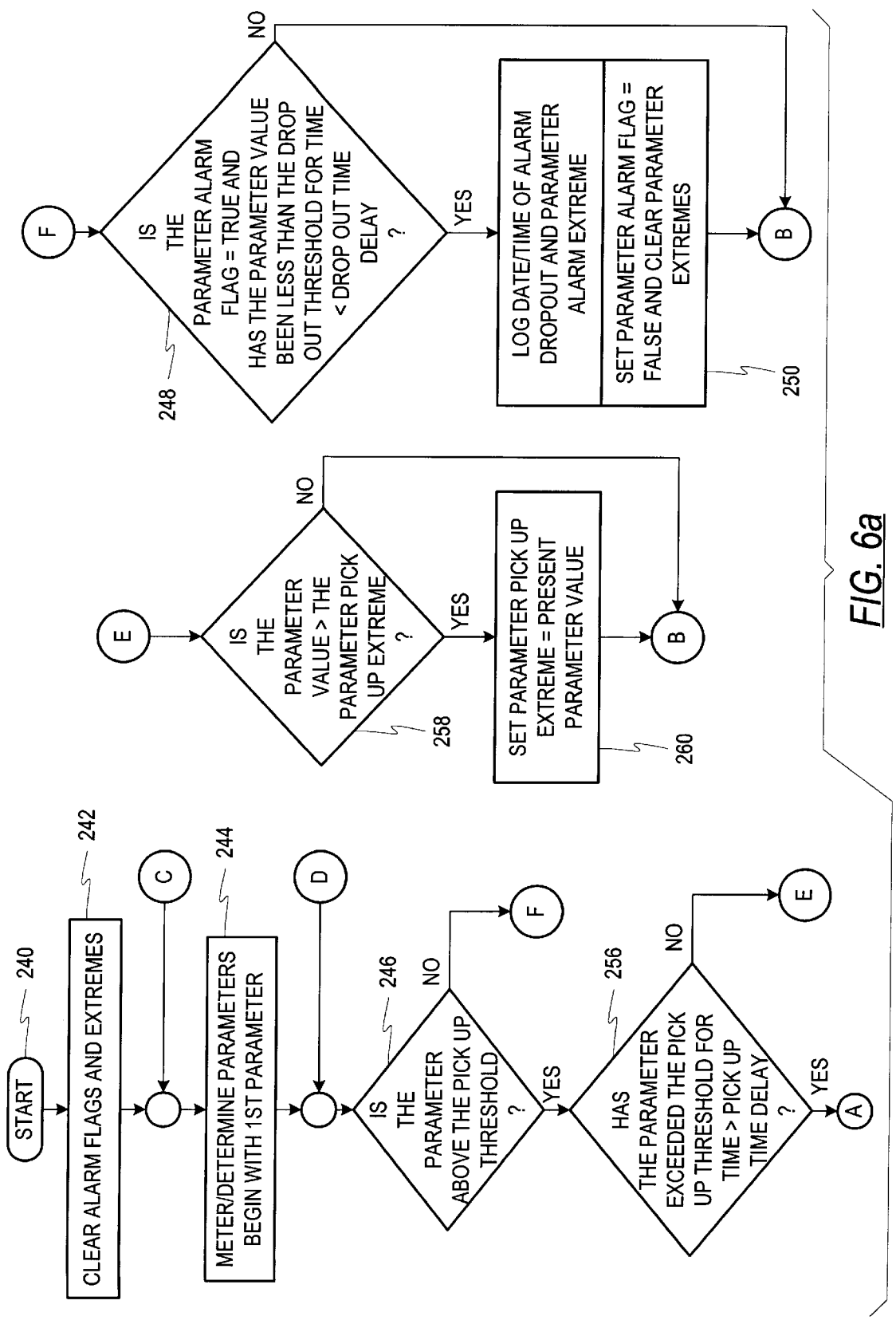
FIGS. 6a and 6b are a flowchart showing the metering unit process for generating the "Data Extreme During Alarm Pickup" and the "Data Extreme During Active Alarm"
Figure 6B:
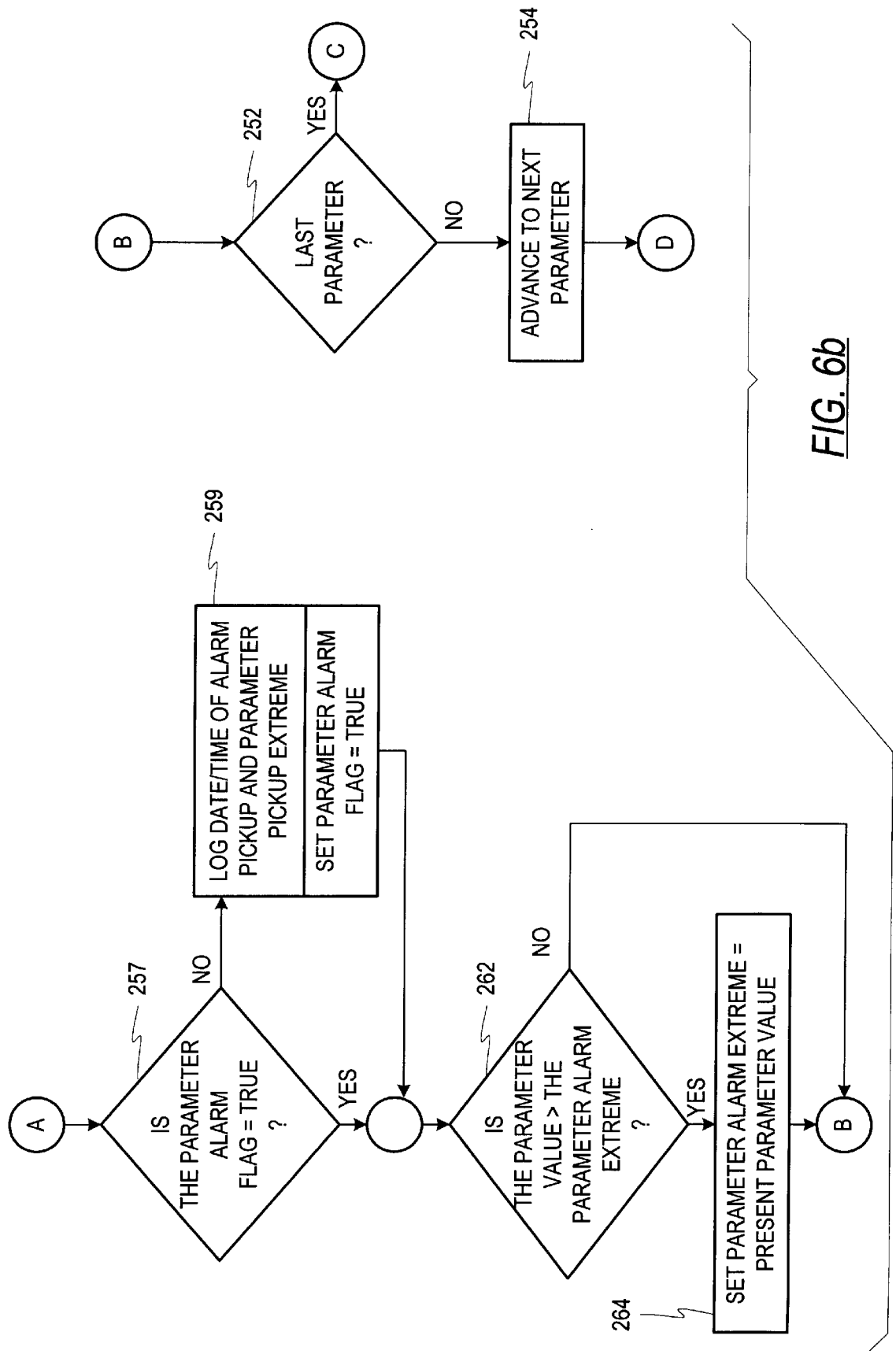

FIGS. 6a and 6b are a flowchart showing the operation for generating the "Data Extreme During Alarm Pickup" and the "Data Extreme During Active Alarm". This operation is programmed into the main functionality firmware in the flash EEPROM 124, 126. While the following description of the flowcharts focuses on over type alarms, it should be understood that data extremes for an under type alarm are obtained in the same manner.

Following a unit reset (step 240), all alarm flags and parameter extremes stored in the nonvolatile RAM 142 are cleared (step 242). Next, after the metering unit 104 generates values for a plurality of parameters (step 244), the value of a first parameter is compared to the preset alarm threshold for that parameter (step 246).

If the parameter value is not above the alarm threshold, then flow proceeds to step 248. At step 248, the parameter alarm flag is checked to determine whether the parameter value had previously surpassed the alarm threshold and whether the parameter value has been less than that threshold for less time than the "dropout time delay" (i.e., the value of the parameter has dropped below the alarm threshold level but has not been below it for the preselected amount of time to deactivate the alarm). If the parameter alarm flag is true and the parameter value has been less than the alarm threshold for less time than the dropout time delay, then the date and time of alarm dropout, the alarm identification, and the "Data Extreme During Active Alarm" are logged in the nonvolatile RAM 142 (step 250). In addition, the parameter alarm flag and the parameter extremes are cleared (step 250). At step 252, it is determined whether the above parameter is the last parameter to be checked for alarm conditions. If the above parameter is the last parameter, then flow proceeds to step 244 where new values are generated the plurality of parameters. If, however, the above parameter is not the last parameter to be checked for alarm conditions, then the value of the next parameter (step 254) is compared to the preset alarm threshold for that parameter beginning at step 246.

Referring back to step 246, if the value of the parameter is above the alarm threshold for that parameter, it is determined whether the parameter has exceeded the alarm threshold for more time than the pickup time delay (step 256). If the parameter has not exceeded the alarm threshold for more time than the pickup time delay, then the present parameter value is compared to the stored value of the "Data Extreme During Alarm Pickup" (step 258). If the present parameter value is greater than the stored "Data Extreme During Alarm Pickup", then the stored value is overwritten with the present greater value (step 260). Otherwise, flow proceeds to step 252 where the check for last parameter is made. At step 256, if the parameter has exceeded the alarm threshold for more time than the pickup time delay, then the status of the alarm flag for this parameter is checked (step 257). If the alarm flag is false, then it is set to true. Also, the date and time of alarm pickup, the alarm identification, and the "Data Extreme During Alarm Pickup" are logged in the nonvolatile RAM 142 (step 259). If the alarm flag is true, indicating an active alarm, then the present parameter value is compared to the stored value for the "Data Extreme During Alarm Pickup" (step 262). This stored value is overwritten with the present parameter value only if the present parameter value exceeds the stored value (step 264). The flow then proceeds to step 252 where the check is made for last parameter.

It can be seen from the foregoing process in FIGS. 6a and 6b that the metering unit 104 obtains the minimum or maximum value of a parameter while an alarm is in pickup and while an alarm is active, without using up large amounts of memory in the metering unit 104, without potentially missing the minimum or maximum value, and without having difficulty in correlating any logged data to the occurrence of the alarm threshold level.

Figure 7:
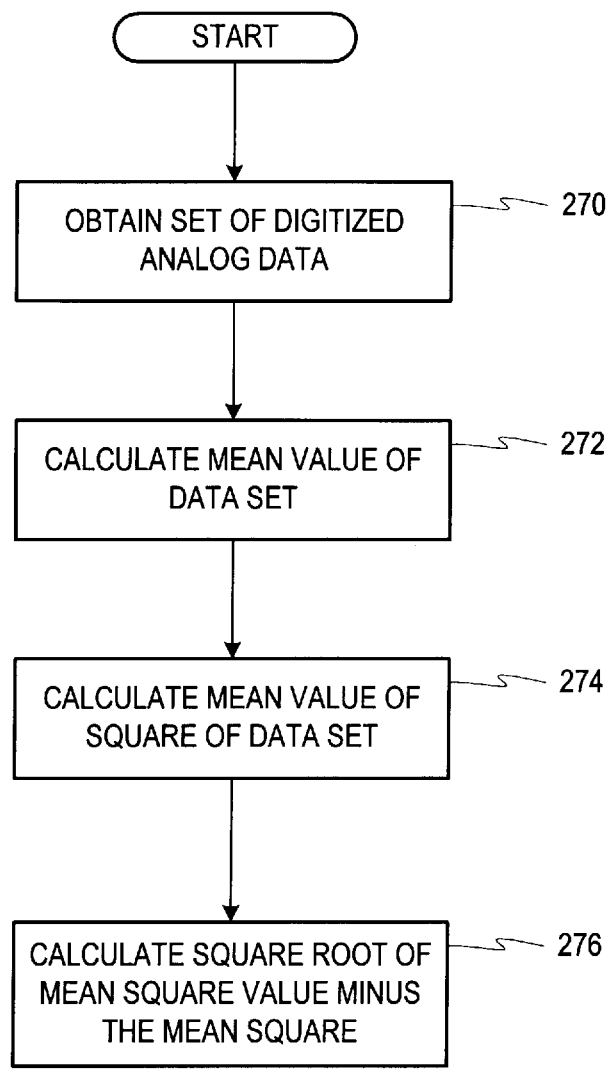
FIG. 7 is a flowchart showing the metering unit process for nulling DC offset errors in each metered AC analog channel.

Yet another feature of the metering unit 104 is that the main functionality firmware in the flash EEPROM 124, 126 includes programming code for minimizing DC offset errors caused by amplifiers in the metering unit 104. The process for minimizing DC offset errors in each AC analog channel is illustrated in the flowchart of FIG. 7.

To begin with, a set of digitized analog data for an AC analog channel is obtained consisting of some integer multiple of cycles of the AC analog channel (step 270). Next, at step 272 the mean value of the data set is calculated as:

$$\text{MeanValue} = \left[ \sum_{i=0}^{N} S_i \right] / N$$

where N is the number of data samples in the set and $S_i$ is the $i^{th}$ data sample. Also, at step 274 the mean square value of the data set is calculated as:

$$\text{MeanSquareValue} = \left[ \sum_{i=0}^{N} S_i^2 \right] / N$$

Finally, at step 276 the rms value of the AC signal from the AC analog channel is equal to the square root of the (mean square value minus the mean squared). This quantity is free of any errors resulting from DC offset. The process in FIG. 7 is applied to each AC analog channel to null DC offset errors arising in each of the channels.

The process in FIG. 7 makes the metering unit 104 immune to variations in DC offset which might occur with temperature or over time, and allows the metering unit 104 to use less expensive voltage references in metering amplification, buffering, and analog-to-digital schemes. Furthermore, the mean value calculated in step 272 may be used to null any DC offset errors in derived quantities, such as power, which are based on a product or sum of the individual metered channels.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A metering unit for monitoring a power line in a distributed power network carrying a power-related waveform from a non-residential load-center to powered equipment, the metering unit using a sensor for sensing power-related parameters associated with the power-related waveform over a plurality of integral metering cycles, said metering unit comprising:
   a generator, responsive to said sensor, for generating data representative of the power-related waveform during each of said metering cycles; and
   a programmable non-volatile memory having stored therein metering logic programmed by a user via a communications port of the metering unit and executable by said generator during each of said metering cycles, said metering logic directing said generator in each of said metering cycles to perform power-related computations and logic evaluations on said data representative of the power-related waveform.

2. The metering unit of claim 1, wherein said programmable memory is implemented using a sector-erasable flash EEPROM.

3. The metering unit of claim 1, wherein said power-related computations and logic evaluations are selected from a group consisting of: if-then-else logic, multiply, divide, add, subtract, modulo operations, minimum or maximum evaluations, Boolean arithmetic, time of day evaluations, and device command control.

4. The metering unit of claim 1, wherein said programmable memory has stored therein initialization logic performed by said generator in response to a reset of the metering unit, said initialization logic initializing one or more parameters employed by said generator to perform said power-related computations and logic evaluations on said data representative of the power-related waveform.

5. The metering unit of claim 4, wherein said programmable memory has stored therein non-metering logic programmable by the user via the communications port of the metering unit and executed by said generator independently from said metering cycles in response to an enable signal, said non-metering logic directing said generator to perform off-line calculations independently from said metering cycles.

6. The metering unit of claim 1, further including communications circuitry, including the communications port, for permitting an external programming device to communicate with the metering unit and download said logic to said programmable memory.

* * * * *